United States Patent [19]

Hoenninger, III

[11] Patent Number: 5,291,610
[45] Date of Patent: Mar. 1, 1994

[54] MICROCODE SEQUENCER CHANGING STATES IN RESPONSE TO AN EXTERNAL GATING INPUT LEVEL CHANGE UPON THE OCCURRENCE OF A WAIT INSTRUCTION

[75] Inventor: John C. Hoenninger, III, Oakland, Calif.

[73] Assignee: The Regents of the University of California, Oakland, Calif.

[21] Appl. No.: 551,798

[22] Filed: Jul. 12, 1990

[51] Int. Cl.$^5$ ............................................. G06F 9/00
[52] U.S. Cl. .................................. 395/800; 395/375; 364/262.4; 364/DIG. 1
[58] Field of Search ................. 395/800, 375; 364/140

[56] References Cited

U.S. PATENT DOCUMENTS

| | | | |
|---|---|---|---|
| 4,707,661 | 11/1987 | Hoenninger, III et al. | 324/309 |
| 4,771,371 | 9/1988 | Wiser et al. | 395/375 |
| 4,837,681 | 6/1989 | Fuller | 395/375 |
| 4,868,469 | 9/1989 | Chan | 318/254 |

FOREIGN PATENT DOCUMENTS 830384 5/1981 U.S.S.R. .

OTHER PUBLICATIONS

Clark, "Pulsed Nuclear Resonance Apparatus", 35 *Review of Scientific Instruments* No. 3, pp. 316-333 (Mar. 1964).
Dick, "A Pulse Programmer For High-Power Nuclear Resonance", 9 *Journal of Physics E: Scientific Instruments*, pp. 1054-1056, (1976).
Conway et al, "Circuit For A Digital Pulse Programmer", 48 *Rev. Sci. Instrum.* No. 6, pp. 656-660 (1978).
Caron, "A New Programmable Timer Designed For Pulsed NMR", 31 *Journal of Magnetic Resonance*, pp. 357-362 (1978).
Case et al, "Versatile Pulse Sequence Generator For Pulse NMR", 35 *Journal of Magnetic Resonance*, pp. 439-445 (1979).
Dart, "Highly Flexible Pulse Programmer For NMR Applications", 51(2) *Rev. Sci. Instrum.*, pp. 224-228 (Feb. 1980).
Thomann et al, "Digital Pulse Programmer For An Electron-spin-resonance Computer-controlled Pulsed Spectrometer", 55(3) *Rev. Sci. Instrum.*, pp. 389-398, (Mar. 1984).
Jensen et al, "A Universal Pulse Programmer for NMR Imaging", *Proceedings of the Third Annual SMRM* p. 379 (1984).
Sidky et al, "State-machine Digital Pulse Generator", 59(5) *Rev. Sci. Instrum.*, pp. 806-810 (May 1988).
Wachter et al, "Enhanced State-machine Pulse Programmer for Very-high-precision Pulse Programming", 59(10) *Rev. Sci. Instrum.* pp. 2285-2289 (Oct. 1988).

Primary Examiner—Thomas C. Lee
Assistant Examiner—Paul Harrity
Attorney, Agent, or Firm—Nixon & Vanderhye

[57] ABSTRACT

A sequencer controller for nuclear magnetic resonance imaging includes a level-sensitive external gating arrangement. When a sequencer microcode WAIT instruction is executed, the gating arrangement operates differently depending on the level of the signal existing at the external gating input. If the external gating signal level is at one level, the gating arrangement causes the sequencer to wait until the external gating input changes level—thus permitting an external gating event (e.g., closure of a breath switch or the like) to interact with and control the timing of the NMR sequence. If the external gating signal is at a different level when the WAIT instruction is first executed, however, the sequencer does not "wait" at all but instead ignores the WAIT instruction and goes to the next sequencer state. Such level sensitive external gating permits microcode sequences including WAIT instructions to be executed when external gating is desired and also when external gating is not desired, thus reducing the amount of code that needs to be maintained.

9 Claims, 8 Drawing Sheets

MICROCODE SEQUENCER CHANGING STATES IN RESPONSE TO AN EXTERNAL GATING INPUT LEVEL CHANGE UPON THE OCCURRENCE OF A WAIT INSTRUCTION

CROSS-REFERENCES TO RELATED PATENT APPLICATIONS

This patent application may be related to the following copending commonly-assigned patent applications:

U.S. Ser. No. 07/571,258 of Hoenninger filed Aug. 23, 1990 entitled "CONTINUOUSLY LOADABLE MICROCODE STORE FOR AN MRI SEQUENCER" now U.S. Pat. No. 5,144,242 issued Sep. 1, 1993; and U.S. Ser. No. 07/579,631 of Hoenninger filed Sep. 10, 1990 entitled "FAST LINKER FOR AN NMR SEQUENCER".

FIELD OF THE INVENTION

This invention relates to nuclear magnetic resonance (NMR) techniques and more particularly to magnetic resonance imaging (MRI). Still more particularly, the present invention relates to pulse sequence generators (so-called "sequencers" or "pulse programmers") for MRI equipment. In more detail, the present invention relates to gating the sequence of pulses produced by an MRI pulse sequence generator with an externally generated signal.

BACKGROUND AND SUMMARY OF THE INVENTION

The fundamentals of the MRI experiment are well known. Briefly (and hopefully without undue oversimplification), in a typical MRI system an object 10 (see FIG. 2) to be imaged (e.g., a portion of the human body) is placed in an external static magnetic field gradient. Protons within the object tend to align their spins in accordance with the magnetic field direction. The object is excited by one or more RF excitation pulses of appropriate frequency, timings and durations (as one example, so-called "spin-echo" type pulse sequences may be used). The RF excitation pulses generated at the Larmour frequency cause the protons to precess their spins. When each RF pulse is switched off, the nucleii precess back toward their equilibrium position and in this relaxation process emit an NMR response that can be detected by an RF receiver.

As is well known, different pulse sequences can be used to obtain different results. A pulse sequence generator (hereafter "sequencer") portion of the NMR system (e.g., often a high-speed piece of hardware based on a bit slice processor architecture) provides the sequence of control signals that controls the operation of the RF transmitter(s), RF receiver(s) and gradient magnet(s). The sequencer must reliably provide a high degree of flexibility (e.g., to provide generation of different desired pulse sequences) as well as adequate time resolution and other important features.

Briefly, a sequencer typically comprises a sequential state machine, with each different state providing different output control signals to control different portions of the NMR equipment (e.g., RF transmitter and receiver, gradient coils, etc.). The "next state" to which the sequencer transitions is typically determined by the sequencer previous state. The time at which the transition occurs is generally variable (since different NMR equipment "states" last for different durations within a typical NMR pulse sequence) and may also be determined by the previous state.

The following is a non-exhaustive listing of some possibly representative prior patents and articles relating to NMR sequencers:

Hoenninger III U.S. Pat. No. 4,707,661 (1987);

Clark, "Pulsed Nuclear Resonance Apparatus", 35 *Review of Scientific Instruments* No. 3, pp. 316-33 (March 1964);

Dick, "A Pulse Programmer For High-Power Nuclear Resonance", 9, pp. 1054-56 *Journal of Physics E: Scientific Instruments* (1976);

Conway et al, "Circuit for a Digital Pulse Programmer", 48 *Rev. Sci. Instrum.* No. 6, pp. 656-60 (June 1977);

Caron, "A New Programmable Timer Designed For Pulsed NMR", 31 *Journal of Magnetic Resonance* 357-62 (1978);

Case et al, "Versatile Pulse Sequence Generator for Pulse NMR", 35 *Journal of Magnetic Resonance* 439-45 (1979);

Dart, "Highly Flexible Pulse Programmer for NMR Applications", 51(2) *Rev. Sci. Instrum.* 224-28 (February 1980);

Thomann et al, "Digital Pulse Programmer for an Electron-spin-resonance Computer-controlled Pulsed Spectrometer", 55(3) *Rev. Sci. Instrum.* 389-98 (March 1984);

Jensen et al, "A Universal Pulse Programmer for NMR Imaging", *Proceedings of the Third Annual SMRM* 379 (1984);

Sidky et al, "State-machine Digital Pulse Generator", 59(5) *Rev. Sci. Instrum.* 806-10 (May 1988); and Wachter et al, "Enhanced State-machine Pulse Programmer for Very-high-precision Pulse Programming", 59(10) *Rev. Sci. Instrum.* 2285-89 (October 1988).

The Hoenninger patent describes a microcoded sequencer having a 96-bit microcode format including an opcode and associated branch address, a time duration, and various control fields. See also the Sidky et al, Caron et al, Wachter et al and Dart et al articles.

Gating an NMR sequencer transition on an external trigger signal is generally known. Such gating may be used to alter the timing of the sequencer (e.g., to cause it to "wait" at a particular point in an NMR pulse sequence until a certain event occurs).

For example, the Dick article describes an external trigger pulse input that "may alternatively be used to initiate only the continuous pulse train."

See also Dart et al, which teaches in FIG. 1 an "external trigger" signal applied through a one-shot and an AND gate to the "start" input of a clock generator and output register of a sequencer. In the Dart et al arrangement, an instruction with a bit 15="0" causes instruction fetching to stop until the next PULSE ENABLE pulse—thus delaying the output of a pulse until an external trigger input goes positive. Dart explains that such an instruction is normally used to set the rate at which a pulse sequence will be repeated.

Prior art MRI equipment marketed by Diasonics MRI division (and now being marketed by Toshiba of America MRI) includes a writeable control store microprogrammed sequencer which accepts an external gating signal. A programmable rate clock controls the time duration of each state in response to a corresponding microinstruction field. A gating circuit within this programmable rate clock precisely alters the normal operation of the programmable rate clock so as to cause the timing of the sequencer to become dependent on the occurrence of an incoming pulse (transition) applied to an "external gate" input.

This external gate signal may be provided by any desired apparatus (e.g., a patient-operated "breath switch", a cardiac cycle detecting cuff, a "back up" push button switch, etc.). A WAIT bit field is provided within a micro-instruction as a control field. This WAIT bit specifies whether the current state is to be gated on receipt of a negative-going external gating pulse edge. When the WAIT bit is asserted, the normal output of programmable rate clock is nullified and the current state persists until a valid external gating pulse is received. Depending upon the contents of an instruction field portion of the microinstruction, a branch to "back up" to an earlier point in the pulse sequence may be effected upon receipt of the external gating pulse, or other desired action (e.g., continue) may be taken.

Figure 1:
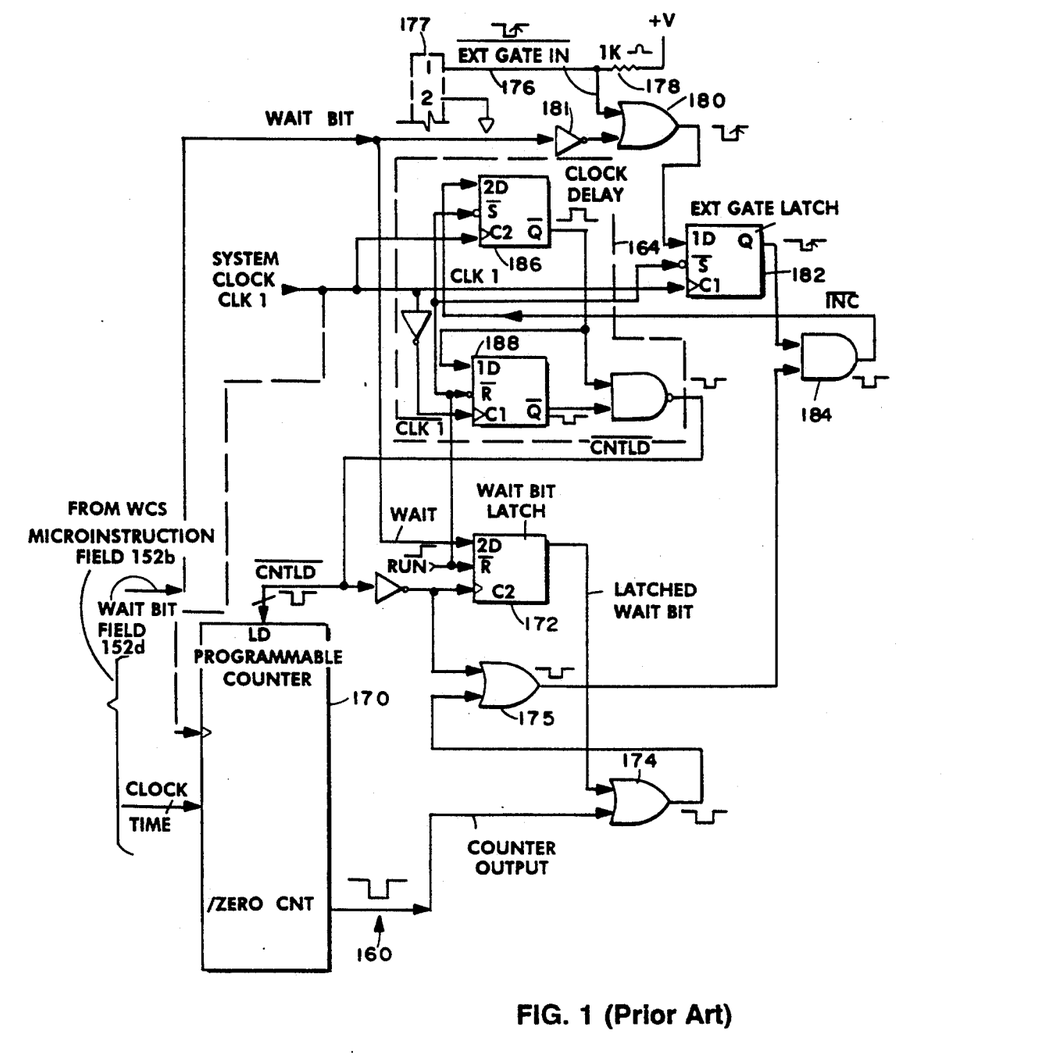
FIG. 1 is a detailed schematic diagram of circuitry within the prior art Diasonics (Toshiba America) MRI sequencer that relates to the externally gated programmable rate clock.

FIG. 1 is a detailed schematic diagram of circuitry within the prior art Diasonics (Toshiba America) MRI sequencer that relates to the externally gated programmable rate clock. When a delay block 164 outputs a load control signal "CNTLD", a programmable counter 170 is loaded from the micro-instruction "clock time" field 152b outputted by a writeable control store ("WCS") 150 (this output of the WCS may first be latched in a temporary holding asynchronous latch before being loaded into the counter 170).

If the WAIT bit field 152d outputted with the micro-instruction clock time field 152b from WCS 150 is unasserted (logic level 0; indicating that the instruction is not to "wait" until an external gating pulse edge is received), inverter 181 applies a logic level 1 to the input of OR gate 180 (thus blocking any transitions applied to the other input of this OR gate by the "/EXT. GATE" line 176 and causing the output of OR gate 180 to remain fixed at logic level 1). Thus, the Q output of external gate latch is at logic level 1 and the output of AND gate 184 remains at logic level 1 until programmable counter 170 generates an active low pulse.

Similarly, the Q output of WAIT bit latch 172 remains at logic level 0—thus permitting OR gate 174 to pass the active low /zero count output of programmable counter 170 when it occurs. The active low /zero count signal is applied to the input of AND gate 184, causing the /INC (active low) signal to be asserted. Upon the zero-to-one transition of the /zero count signal, the /INC signal undergoes a similar zero-to-one transition—causing clock delay block 186 (effectively a falling edge sensitive one-shot) to produce an active low /CNTLD signal. This /CNTLD signal controls programmable counter 170 to load the microinstruction field 152b from the writable control store and to begin timing the duration of the next state. /CNTLD also loads WAIT bit latch 172 with the WAIT bit field.

Assume now that the WAIT bit field 152d outputted with the micro-instruction clock time field 152b from WCS 150 is asserted (logic level 1) to indicate that the instruction is to wait until an external gating pulse edge is received. WAIT bit latch 172 is thus set by clock CNTLD (i.e., its output takes on a logic level 1)—thereby forcing OR gate 174 to have a logic level 1 input. With this logic level 1 input being applied to OR gate 174, the OR gate blocks the active low /zero count output of programmable counter 170. Counter 170 begins counting down from its preset value (to time the duration of the current state) and produces a /zero count output when it has counted down to zero (thereby timing the delay specified by the clock time field 152b previously loaded into it). This /zero count signal is applied by counter 170 to the other input of OR gate 174. However, since the WAIT bit latch 172 is set, the /zero count signal has no effect on the output of OR gate 174.

Thus, when the time specified by the micro-instruction clock time field 152b elapses, the WAIT bit latch Q output causes the output of OR gate 174 to remain high (and the corresponding input of AND gate 184 to also remain high) regardless of the state of the counter 170 /zero count output. The output of gate 184 will not change state under these circumstances until an external active-low gating pulse having a duration longer than the period of the sequencer system clock period (e.g., 0.5 microseconds) is received—as will now be explained.

An external gate connector line 176 (labelled "/EXT GATE") is normally pulled up by a pull-up resistor 178 to logic level 1. A logic level 1 on the WAIT bit causes inverter 181 to produce a logic level 0 signal level—thus permitting OR gate 180 to pass signals present on the /EXT GATE line.

When a transition (e.g., caused by closing and opening a switch connected to the connector 177) is applied to /EXT GATE line 176 while the WAIT bit is ON (either before or after the counter 170 has counted down), the output of OR gate 180 follows the /EXT GATE signal. An active low output of OR gate 180 is synchronized by external gate latch 182 (a synchronous D flip-flop in the preferred embodiment) upon the occurrence of the next positive-going edge of the system clock signal CLK1 to provide a logic level 0 active level on the Q output of the external gate latch 182. The resulting active low output of the external gate latch Q output 182 forces the output of AND gate 184 low, thus causing an (active low) increment signal /INC to be generated. This /INC signal remains at logic level 0 until the /EXT GATE signal returns to logic level 1. /INC causes the transition to the next microinstruction state. Clock delay circuit 164 produces a short /CNTLD active low pulse to cause the counter 170 to load and to load WAIT bit latch 172 (and to cause OR gate 175 to block the /zero count output of programmable counter 160 when it is loaded). A sequencer state transition on the next /ZERO CNT assertion thus may not occur unless the /EXT GATE signal exhibits a rising edge transition before /ZERO CNT is asserted.

The external gating arrangement shown in FIG. 1 has been highly successful in reducing motion artifacts within MRI images. However, further improvements are possible.

The FIG. 1 gating arrangement was designed with the concept of providing gated and ungated versions of certain microprograms in mind. Often, however, exactly the same pulse sequence might be operated in gated and ungated modes. When the prior art (FIG. 1) gating arrangement was designed, it was assumed that a gated version (i.e., WAIT bit asserted) of a particular microprogram would be run if externally gated operation was desired and that a non-gated (i.e., WAIT bit unasserted) version would be executed if no external gating was desired.

However, it has now been discovered that rather than writing some routines that are gated based on an external gating signal and writing other routines that are not gated, it may be desirable to use exactly the same microprogram for both gated and non-gated operations—and provide a mechanism related to the external gating system itself specifying or controlling at time of execution whether or not the pulse sequence specified by the microprogram is to be externally gated.

Thus, a microprogram could be written with external gating capability, but the gating function might be only selectively enabled (e.g., based on whether or not an external gating apparatus is connected at the time the microprogram is executed). By initially writing microprograms to include an external gating operation and by providing a means by which the gating can be selectively enabled or disabled at time of execution, the quantity of code to be written and maintained can be significantly decreased—since there is no longer a need to provide gated and ungated versions of the same microprograms. Moreover, overall flexibility and functionality can be significantly increased because even microprograms that may rarely be externally gated can nevertheless be written in a manner that provides external gating (and whether or not the microprogram is externally gated will depend on gating conditions existing at time of execution).

It will be apparent to those skilled in this art that the FIG. 1 external gating arrangement is not particularly suited for allowing a given microsequence to be executed in either a gated mode or an ungated mode. As mentioned, the FIG. 1 circuit is sensitive to the occurrence of a rising edge transition of the /EXT GATE signal. If the /EXT GATE signal is asserted all of the time, no such transition will occur. Once the WAIT bit is asserted HIGH by the writable control store, the Q output of external gate latch 182 changes state on the following edge of clock signal CLK1. With /INC held LOW, no further /CNTLD signals are generated unless a transition occurs on the /EXT GATE signal.

Thus, once the WAIT bit is asserted HIGH, the sequencer will wait for a rising edge transition in the external gating signal before the next state is allowed to complete. If an external gating signal transition does not occur, the sequencer simply "hangs"—a highly disadvantageous operating condition if the operator does not intend external gating to be in effect.

Sometimes, an external gating pulse generator has been used with systems employing the transition-sensitive external gating circuit arrangement shown in FIG. 1 in order to avoid these problems. It is possible to prevent the sequencer from "hanging" by connecting to the external gating input a clock pulse generator producing a periodic clock pulse signal of an appropriate frequency. Such a clock pulse generator has the effect of guaranteeing that an external gating pulse will be provided shortly after the programmable counter 170 counts down to zero and the INC signal is held LOW. The system continues to gate in response to external gate signal transitions, but the external clock generator simply guarantees that an external gate signal transition will occur before the sequencer waits more than a negligible amount of time.

Unfortunately, it is highly inconvenient for the operator to have to connect an external clock generator to the gating input whenever no gating is desired. Such an external clock generator provides another point at which failure can occur and another thing for the operator to remember to check when a failure mode is exhibited.

It would be highly desirable to eliminate this extra source of operator error and possible cause of failure. It would also be highly desirable to permit the system to execute the microinstructions programmed for gating in either a gated mode or in an ungated mode—depending merely upon whether or not an external gating device is coupled to the external gating input.

The present invention provides an improved external gating technique for a microcoded NMR sequencer which is sensitive to the level (rather than to transitions) of the external gating signal.

In accordance with one aspect of the present invention, the sequencer detects the level of the external gating signal very soon after it has first begun executing an instruction specifying a wait on external gating. One external gating signal level specifies that the instruction with WAIT asserted or WAIT instruction is to be ignored, and another external gating signal level specifies that a wait on an external gating event is to occur. If the level of the external gating signal is such that the WAIT bit asserted is to be ignored, the sequencer state transition occurs immediately without waiting for the external gating event. The "clock time" field is ignored. Microinstruction routines can be designed (i.e., by appropriate placement of the WAIT instruction) such that the short delay does not adversely affect the NMR experiment—and the experiment may thus proceed essentially continuously.

On the other hand, if a WAIT instruction is encountered and the external gating signal is at a level indicating that external gating is active, the sequencer will wait until the level of the external gating signal changes before going to the next state.

Thus, the very same WAIT instruction is treated in two different ways by preferred embodiment sequencer depending upon the level of the external gating signal—with the external gating signal level effectively disabling the WAIT instruction state if external gating is not desired. In this way, the microinstruction sequences containing WAIT instructions may be operated in either a gated or a non-gated mode—depending upon the level of the external gating input that exists at the time the sequencer executes the instructions.

BRIEF DESCRIPTION OF THE DRAWINGS

These and other features and advantages of the present will be better and more completely understood by referring to the following detailed description of presently preferred exemplary embodiments in conjunction with the drawings, of which.

DETAILED DESCRIPTION OF A PRESENTLY PREFERRED EXEMPLARY EMBODIMENT

Figure 2:
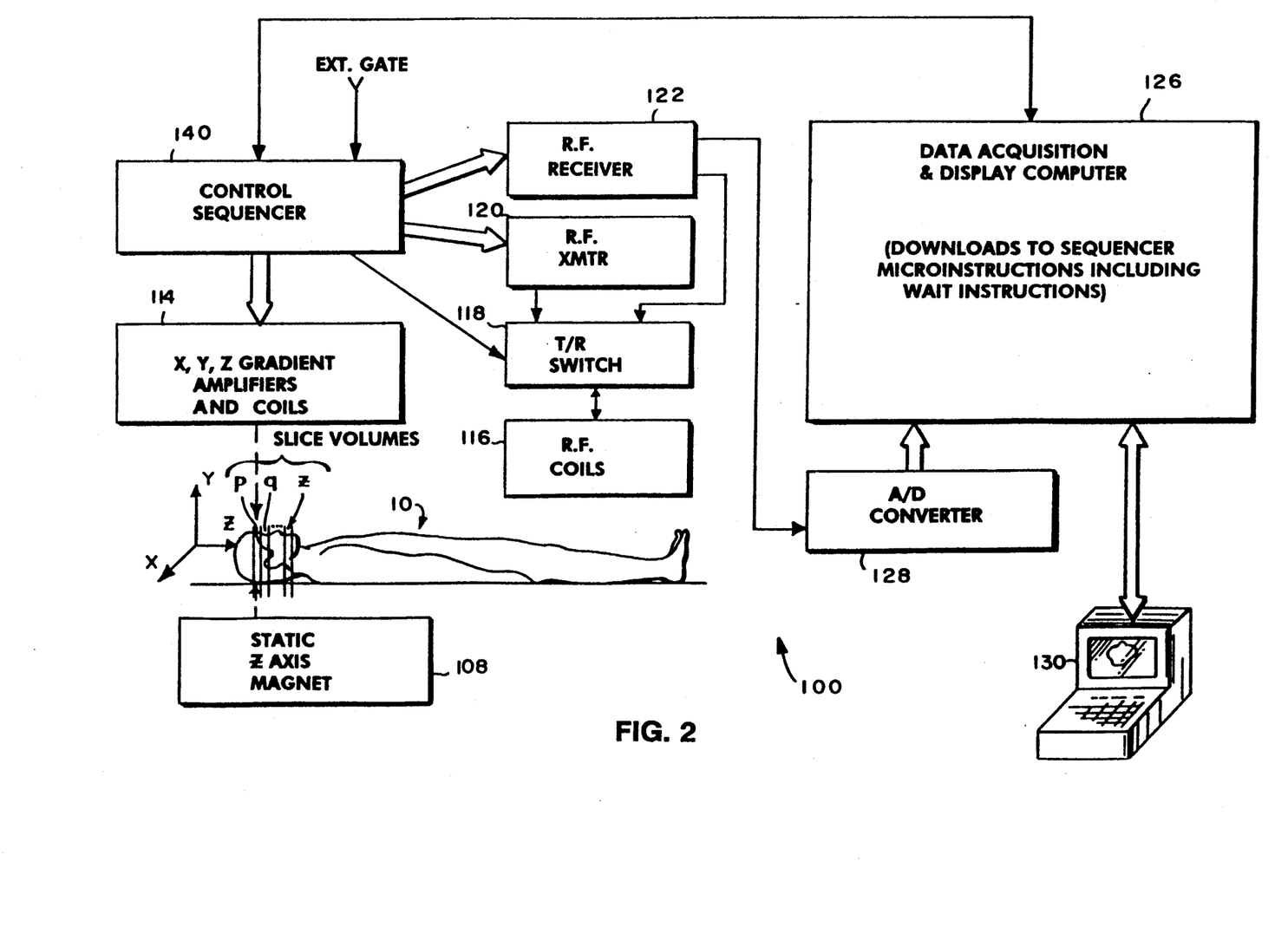
FIG. 2 is an overall block diagram of a presently preferred exemplary embodiment of an NMR system in accordance with the present invention.

The block diagram of FIG. 2 depicts the general architecture of an example of an NMR imaging system 100 of the type with which the microcode sequencer with external gating capability may be used.

Typically, a human or animal subject (or any other object to be imaged) 10 is placed within a static magnetic field. For example, the subject may lie along the z-axis of a static magnet 108 which establishes a substantially uniform magnetic field directed along the z-axis within the portion of the object 10 of interest. For example, contiguous parallel slice-volumes p,q ... z may be located within the volume to be imaged. Gradients (e.g., a fixed weak z gradient) may be imposed within this z-axis directed magnetic field along mutually orthogonal x,y,z axes by a set of x,y,z gradient amplifiers and coils 114 to phase encode the resulting NMR response signals which are generally then read out with the gradients turned off. NMR RF signals are transmitted into the object 10 and NMR RF responses are received from the object via RF coils 116 connected by a conventional transmit/receive switch 118 to an RF transmitter 120 and RF receiver 122. As will be appreciated by those in the art, separate transmit and receive coils may be used in some installations in which case the T/R switch 118 may not be needed.

All of the prior mentioned elements may be controlled, for example, by a control sequencer 140 which communicates with a data acquisition and display computer 126. The latter computer 126 may also receive NMR responses via an analog-to-digital converter 128. A CRT display and keyboard unit 130 is typically also associated with the data acquisition and display computer 126.

As will be apparent to those in the art, such an arrangement may be utilized so as to generate desired sequences of magnetic gradient pulses and NMR RF pulses and to measure the desired NMR RF responses in accordance with stored computer programs.

Figure 3:
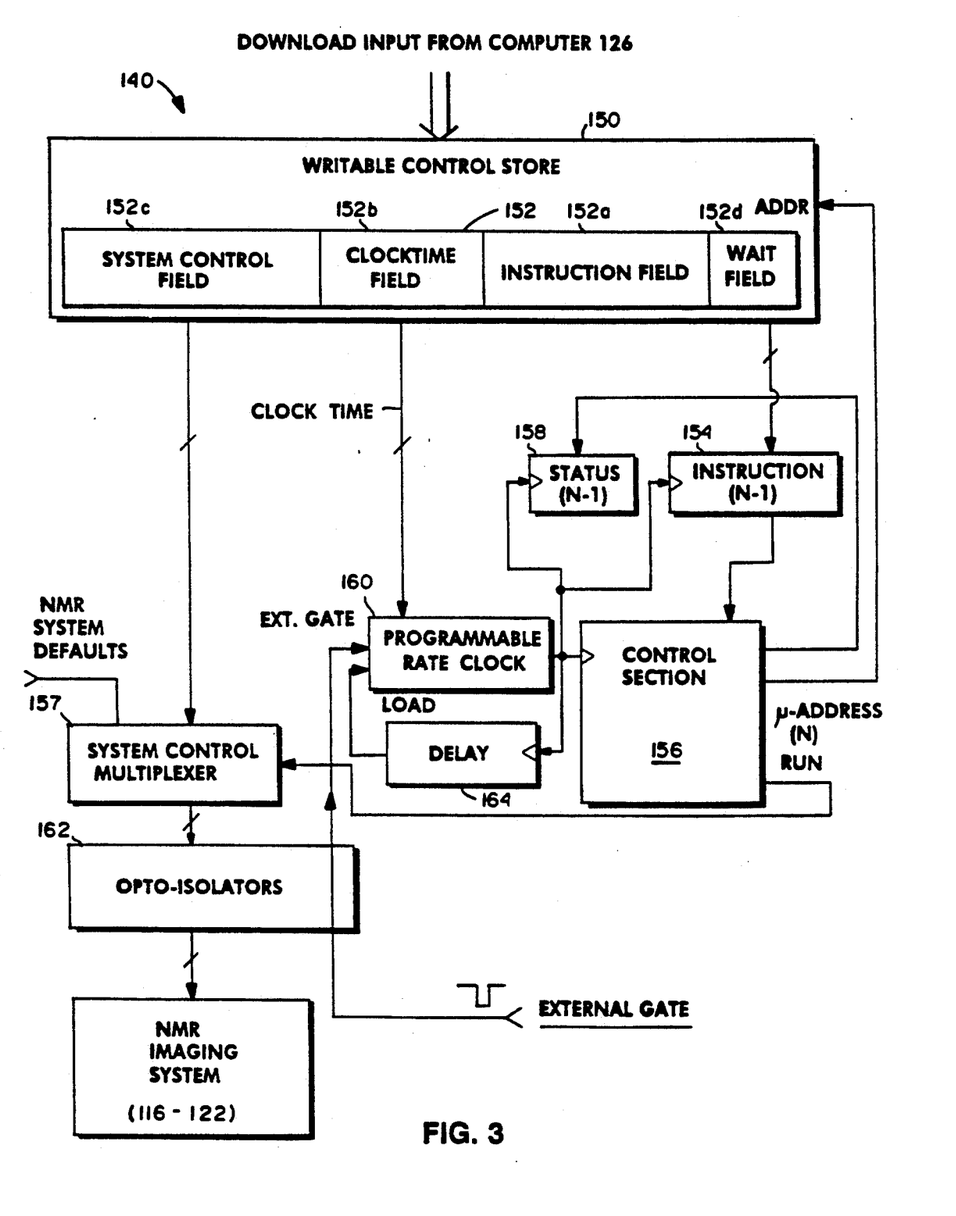
FIG. 3 is a block diagram of the control sequencer 140 shown in FIG. 2 for the first presently preferred exemplary embodiment in accordance with the present invention.

FIG. 3 is a high level block diagram of the architecture of the sequencer 140 shown in FIG. 2 for a first exemplary embodiment in accordance with the present invention. This FIG. 3 design is based on a conventional bit-slice CPU architecture but includes some significant enhancements which optimize the architecture for NMR pulse sequencing.

Sequencer 140 shown in FIG. 3 (which may be characterized as a state machine) includes a writable control store ("WCS") 150, a control section 156, a system control multiplexer 157, and a programmable rate clock 160. Control store 150 stores a sequence of micro-instructions—each micro-instruction specifying a sequence of states and associated system control outputs. Control section 156 addresses control store 150 to obtain the micro-instruction corresponding to a next sequencer state.

The WCS 150 may also be written to and read from by data acquisition computer 126, and appropriate mechanisms are provided for permitting this computer 126 to also address and access WCS at appropriate times. WCS 150 in the preferred embodiment thus includes a random access memory (RAM) the contents of which can be downloaded so as to contain a desired microprogram.

Exemplary micro-instructions each occupy the entire width of the WCS 150 at a corresponding address. The micro-instructions (an exemplary abbreviated format for which is shown at 152) each include an instruction field 152a, a clock time field 152b, and a system control field 152c and a WAIT field 152d.

The instruction field 152a preferably contains an operational code or equivalent that controls state branching by the sequencer. For example, instruction field 152a may contain a branch "op code" (e.g., "continue", unconditional jump, or conditional jump) and associated relative or absolute address information specifying a branch location of WCS 150 to branch to.

This instruction field 152a is latched by an instruction latch 154 that takes the place of the pipeline register found in a conventional bit-slice processor architectures. Such conventional pipeline registers generally include an instruction register containing the present (Nth) instruction and associated control fields. In the FIG. 1 sequencer architecture, however, the instruction register 154 contains not the current (Nth) instruction field but rather the instruction field from the last (N−1th) instruction. This register 154 is therefore not a "pipeline register" at all, but rather contains the (N−1th) microinstruction (with the (N−1th) status information being stored in status register 158). Due to the relatively slow speed of operation of sequencer 140 (i.e., the hardware operates much faster than events occur in the NMR system), it is possible to select the present micro-address directly with the control section 156 and output the system control field 152c directly from the writable control store.

In the preferred embodiment sequencer 140, a state change is initiated to cause control section 156 to address a next microinstruction stored within WCS 150. This is done by loading the current instruction field 152a into instruction register 154. Control section 156 immediately decodes the instruction contained within register 154 and generates the address (N) of the next microinstruction to be fetched. Control section 156 applies the address (N) to WCS 150 to immediately fetch the next microinstruction. The next microinstruction is thus available at the output of WCS 150 and ready to be latched no later than 250 ns after the current instruction field was latched. The different fields 152a–d are applied to different portions of the sequencer 140. For example, the system control field 152c is applied to system control multiplexer 157 so as to control various portions of the imaging system 116–122; the clock time field 152b is latched into programmable rate clock 160; and the WAIT field 152d is latched into control section 156.

The system control field 152c of microinstruction format 152 contains control information for controlling various aspects of NMR system 100. System control multiplexer 157 selects, during periods of inactivity, NMR system default signals to prevent damage to the system and during otherwise selects output signals provided by the current micro-instruction. The selected output signals are applied (via optoisolators 162) to control various aspects of the NMR system (e.g., RF pulse ON/OFF state and RF frequency, the magnitudes of X, Y and Z magnetic field gradients, etc.).

In performing an NMR pulse sequence, speeds on the order of those needed in CPUs are almost never encountered. However, sequencer 140 must be capable of producing highly repeatable and simultaneous sequences of a large number of multi-bit control fields at highly precise timings. The timing resolution is especially critical (e.g., a resolution of on the order of 250 ns is desirable) and timing must also be adjustable over a wide range (e.g., 250 ns to 8 seconds). In the design shown in FIG. 3, these timing requirements are met by storing in each instruction a 15-bit clock time (within field 152b) along with a single bit scaler select. The contents of clock time field 152b are applied to control programmable rate clock block 160, which in turn provides timing signals to control the timing of control section 156 and other portions of sequencer 140. Programmable rate clock block 160 very precisely times a delay having a duration responsive to the contents of clock time field 152b, this time delay controlling the duration of the current state (corresponding to the current—that is, the Nth—instruction).

In order to permit the micro-instruction clock time field 152b to contain timing information associated with execution of the (current) instruction in which the field appears, it is necessary to load programmable clock block 160 for instruction N a short delay time after control section 156 generates micro-address N. Registers 154, 156 delay the instruction field 152a and the status information for the current (Nth) instruction until the programmable rate clock block 160 processes clock time field 152b for the current instruction. A delay block 164 introduces a suitable delay for loading programmable rate clock 160 with the contents of clock time field 152b to ensure that the programmable rate clock is loaded a short delay time after the current micro-address (N) is generated by control section 156.

In the preferred embodiment (as will be understood), microinstruction sequences typically include instructions of various different types. Most instructions will have an instruction field corresponding to "CONTINUE", and will include a system control field 152c specifying the control states of the various portions of the NMR system (e.g., RF transmitter on/off, gradient magnet intensities, etc.) and a clock time field 152b specifying the duration of that sequencer state (i.e., how long the NMR system is to maintain the particular control settings specified by control field 152c). Some microinstructions may specify a conditional or unconditional branch to another microinstruction. And some microinstructions may invoke the WAIT field in the preferred embodiment.

A microinstruction specifying a wait has a WAIT bit field 152d asserted. Such a WAIT instruction in the preferred embodiment typically has a defined system control field 152c which sets the NMR system control parameters to states that may be maintained while waiting a relatively long time for an external gating signal to occur. The clock time field 152b may be undefined in a WAIT instruction since the duration of the instruction will depend on when the external gating signal occurs. Thus, in the preferred embodiment the clock time field 152b sets no "minimum" duration or the like for the current sequencer state; as soon as the external gating signal occurs, a sequencer state transition will occur.

In accordance with an important feature of one aspect of the present invention, if the level of the external gating signal is such that the WAIT bit is to be ignored, the sequencer state transition will occur at the very next system clock cycle and the effect of the WAIT instruction will thus be to introduce an extremely short delay of one system clock cycle duration. Microinstruction routines can be designed (i.e., by appropriate placement of the WAIT instruction) such that the short delay does not adversely affect the NMR experiment—and the experiment may thus proceed essentially continuously.

On the other hand, if a WAIT instruction is encountered and the external gating signal is at a level indicating that external gating is active, the sequencer will wait until the level of the external gating signal changes before going to the next state. Thus, the very same WAIT instruction is treated in two different ways by preferred embodiment sequencer 140 depending upon the level of the external gating signal—with the external gating signal level effectively disabling the "wait" if external gating is not desired. In this way, the microinstruction sequences containing WAIT instructions may be operated in either a gated or a non-gated mode—depending upon the level of the external gating input that exists at the time the sequencer executes the instructions.

Figure 4:
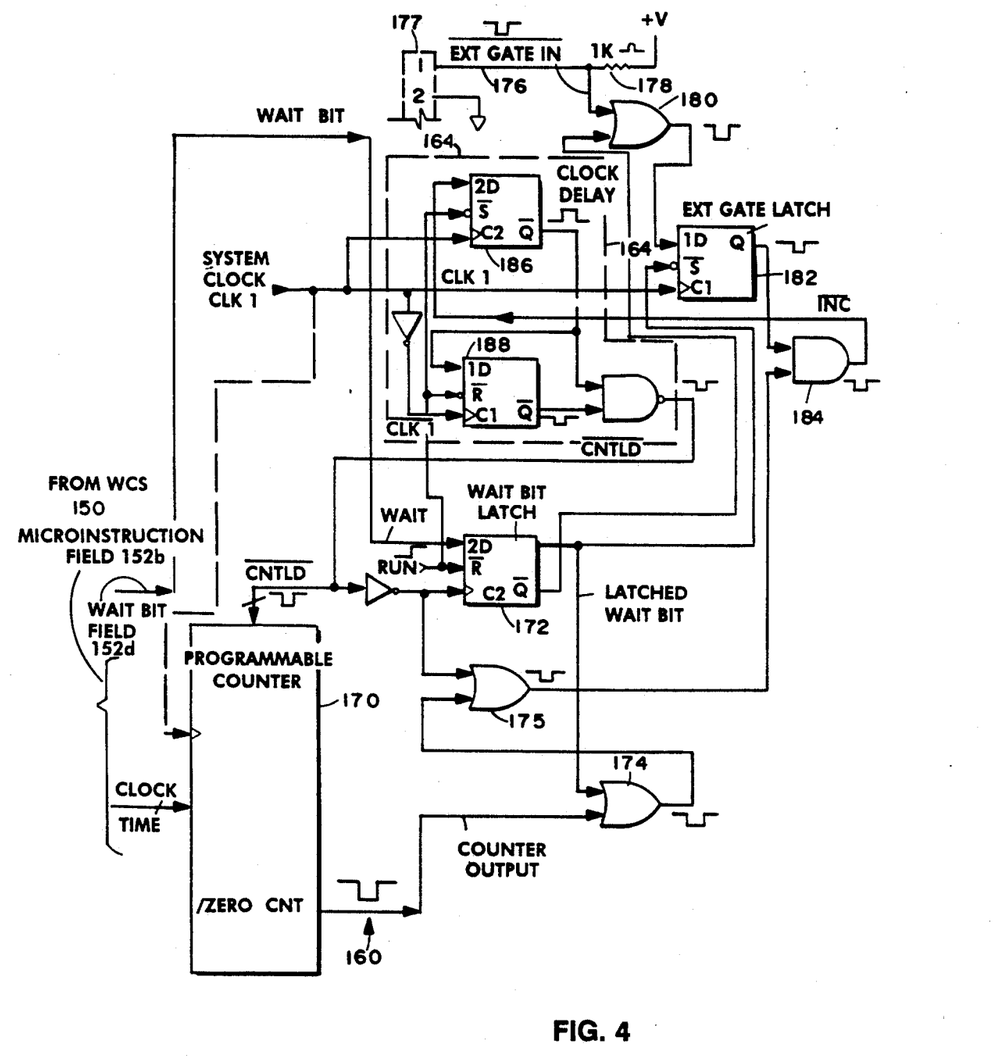
FIG. 4 is a schematic diagram of programmable rate clock sequencer circuitry in accordance with a first presently preferred exemplary embodiment in accordance with the present invention.

FIG. 4 is a schematic diagram of the external gating circuitry of a discrete logic based preferred exemplary embodiment of the present invention. It will be noted that the FIG. 4 circuit is very similar to the circuit shown in prior art FIG. 1 (with corresponding reference numerals referring to corresponding structures). However, unlike in the FIG. 1 circuit both the inverted Q and non-inverted /Q outputs of WAIT bit latch 172 are used in the FIG. 4 circuit. Inverter 181 shown in FIG. 1 is eliminated and the /Q output of WAIT bit latch is connected instead to the input of OR gate 180. The Q output of WAIT bit latch 172 is also connected to the asynchronous set input of /EXT GATE latch 182. A logic level 0 input applied to the /S input of external gate latch 182 causes the external gate latch output Q to rise to logic level 1; while a logic level 1 input applied to this "S" input permits the external gate latch to load the value presented to it on its "D" input.

The operation of the FIG. 4 circuit will now be described.

As in the FIG. 1 circuit, a WAIT bit asserted by WCS 150 is required before sequencer 140 will wait. If the WAIT bit is not asserted, WAIT bit latch 172 remains reset (i.e., a logic level 0 exists on its non-inverted Q output and a logic level 1 exists on its inverted /Q output). A logic level 1 thus is applied to the input of OR gate 180 by the inverted /Q output of the WAIT bit latch—effectively blocking the /EXT GATE signal from reaching external gate latch 182. Since the Q output of WAIT bit latch 172 is at logic level 0 when the WAIT bit is not asserted, the external gate latch 182 is held in a state wherein a logic level 1 exists on its Q output at all times. This logic level 1 signal is applied to the corresponding input of AND gate 184. The result of the WAIT bit being 0 is that as soon as the programmable counter 170 counts down, an active level signal is applied to the other input of AND gate 184 to generate an active "/INC" signal—thus initiating a sequencer state transition.

On the other hand, if the WAIT bit is asserted, WAIT bit latch 172 is set when /CNTLD is asserted (a logic level 1 exists on its Q output and a logic level 0 exists on its /Q output)—thereby forcing OR gate 174 to block the /zero count output of programmable counter 170. The logic level high Q output of WAIT bit latch 172 is also applied to the /S input of external gate latch 182, permitting the external gate latch 182 to take on the level provided at the output of OR gate 180.

Since the /Q output of WAIT bit latch 172 is low when the WAIT bit is set, a logic level 0 signal is applied to the corresponding input of OR gate 180—and the output level of the OR gate is determined by the level of the external gating input signal /EXT GATE. If external gating is not desired, the "external gate in" line 176 is pulled low to logic level 0 by an external device. If external gating is desired, on the other hand, an external gating device is connected to connector 177, this external gating device providing an active high level (with the end of the wait state to occur when the external gating signal level changes from high to low). As will now be explained, when a constant logic low level exists on /EXT GATE line 176, no wait is effected.

When no gating is desired, a logic level 0 signal is passed by OR gate 180 to the D input of external gate latch 182 when the WAIT latch 172 is set by a WAIT instruction. This logic level 0 input signal causes the Q output of the external gate latch 182 to become logic level 0 on the next system clock transition, applying a corresponding logic level 0 to the input of AND gate 184 and causing the /INC signal drop to logic level 0 (the other input of AND gate 184 is held high by the WAIT bit latch 172 Q output through OR gates 174, 175. Thus, no waiting occurs even though the WAIT bit is set—since the level of the external gating signal is at logic level 0 and therefore effectively causes sequencer 140 to ignore the WAIT bit and transition to the next sequencer state.

If there is an external gating device coupled to the "external gate in" connector 177, on the other hand, the "external gate in" line is pulled up to logic level 1 except when an active low gating signal level is present. A logic level 1 signal is thus applied to the input of OR gate 180—causing a logic level 1 signal to be generated at the output of this OR gate (the level of the output of this OR gate following the level of the external gating signal). This logic level 1 signal causes external gate latch 182 to continue to provide a logic level 1 signal on its Q output at the next system clock pulse after starting a WAIT instruction, thus applying a logic level 1 signal to the corresponding input of AND gate 184. Since the output of OR gate 175 is also at logic level 1 when a WAIT instruction causes WAIT latch 172 to be set, the output of AND gate 184 remains at logic level 1 until the external gating signal causes the external gate latch Q output to change to a logic level 0.

The sequencer thus remains in this wait state until the level of the "external gate in" signal drops to logic level 0. The output level of OR gate 180 follows the level of the "external gate in" signal, thus presenting a logic level 0 signal to the "D" input of external gate latch 182. The external gate latch 182 is soon thereafter clocked (thus synchronizing the "external gate in" signal with the clock signal CLK1) so as to cause external gate latch Q output to go to logic level 0. This logic level 0 signal is applied by external gate latch 182 to the input of AND gate 184, and the AND gate output goes to logic level 0 (active) so as to generate the "/INC" signal and thus cause the next state transition to occur. When the next microinstruction has the WAIT field deasserted, WAIT latch 172 Q output causes a low at the /S input of EXT GATE latch 182. The Q output of latch 182 goes high as does the associated input of AND gate 184. This causes /INC to go high, allowing the correct execution of the microinstruction.

Figure 5:
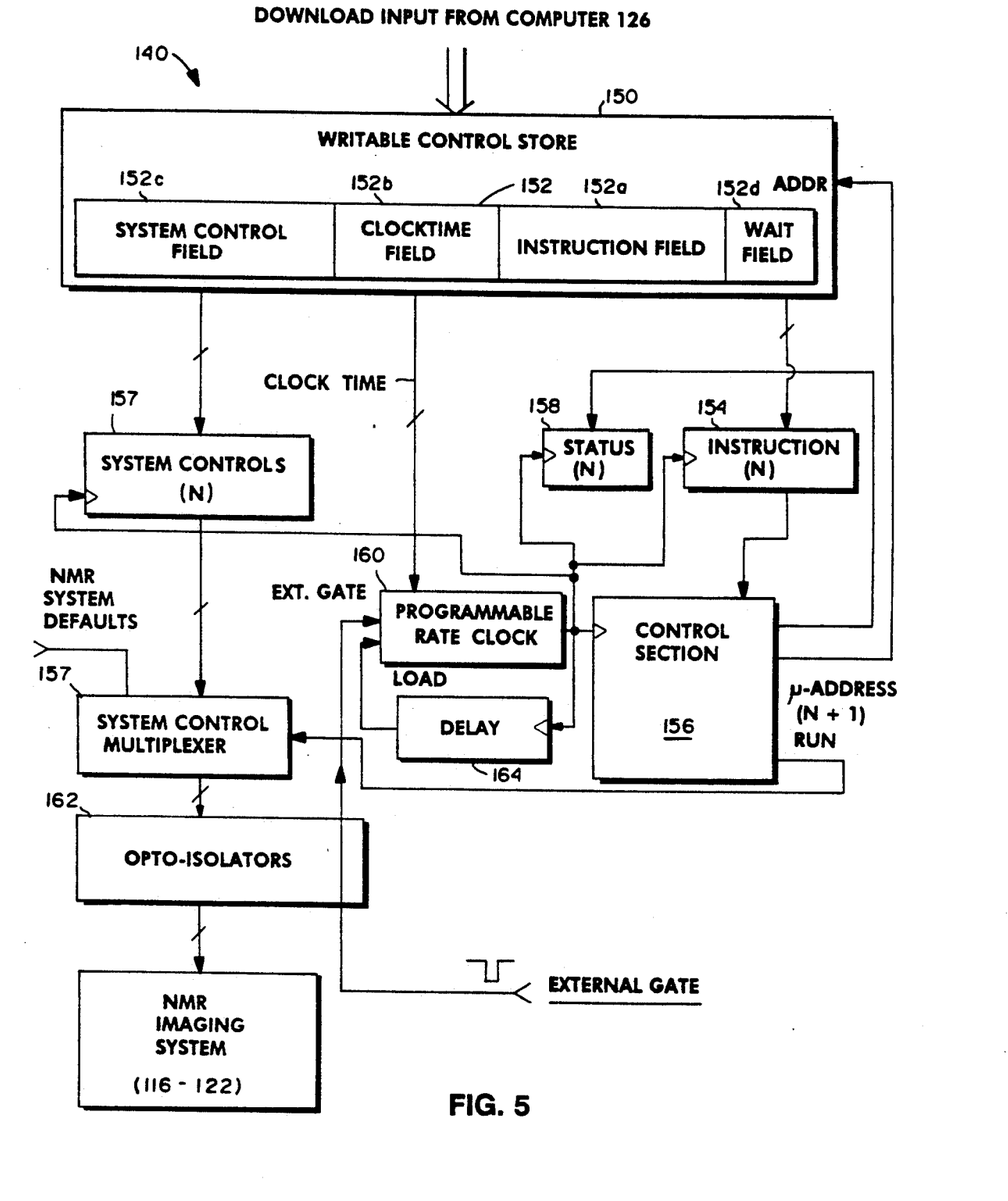
FIG. 5 is a block diagram of the FIG. 2 control sequencer for a further presently preferred exemplary embodiment in accordance with the present invention.

FIG. 5 is a high level block diagram of the architecture of the further exemplary embodiment of the sequencer 140 shown in FIG. 2 in accordance with the present invention. This FIG. 5 design is similar to the FIG. 3 block diagram of the first exemplary embodiment except for the use of a pipeline register. The FIG. 5 architecture is designed to operate four times faster (250 nsec state transition instead of 1000 nsec) than the FIG. 3 architecture. For this reason a pipeline register is used composed of registers 154, 157 and 158 to hold the current sequencer state N. The next state is addressed by the control section 156 as soon as possible after the state transition to state N. State N+1 is present at the output of the writable control store 150 within 250 nsec. If state N has a duration of only 250 nsec, then the pipeline register is loaded with state N+1 immediately due to an output from programmable rate clock 160. If state N lasts longer than 250 nsec, then the output from WCS 150 is not used immediately.

This FIG. 5 architecture is faster than the FIG. 3 architecture since the next state is always addressed immediately rather than waiting for programmable rate clock 160 to generate a pulse indicating an immediate state transition, at which time it would be too late to access the N+1 state from the WCS 150. With respect to the WAIT bit field and all other system functions, the FIG. 5 architecture is similar to the FIG. 3 architecture.

Figure 6A:
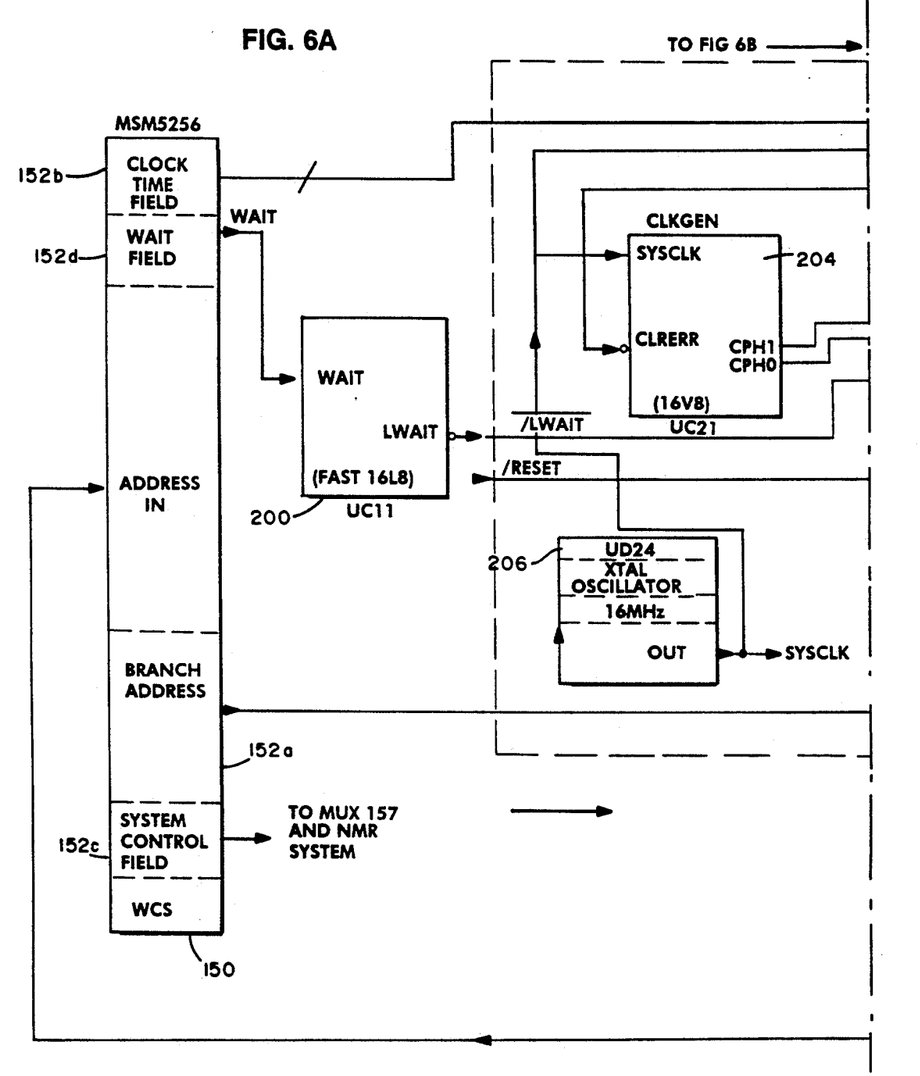
FIGS. 6A and 6B are together a schematic diagram of programmable rate clock and associated circuitry in accordance with a further presently preferred exemplary embodiment in accordance with the present invention.
Figure 6B:
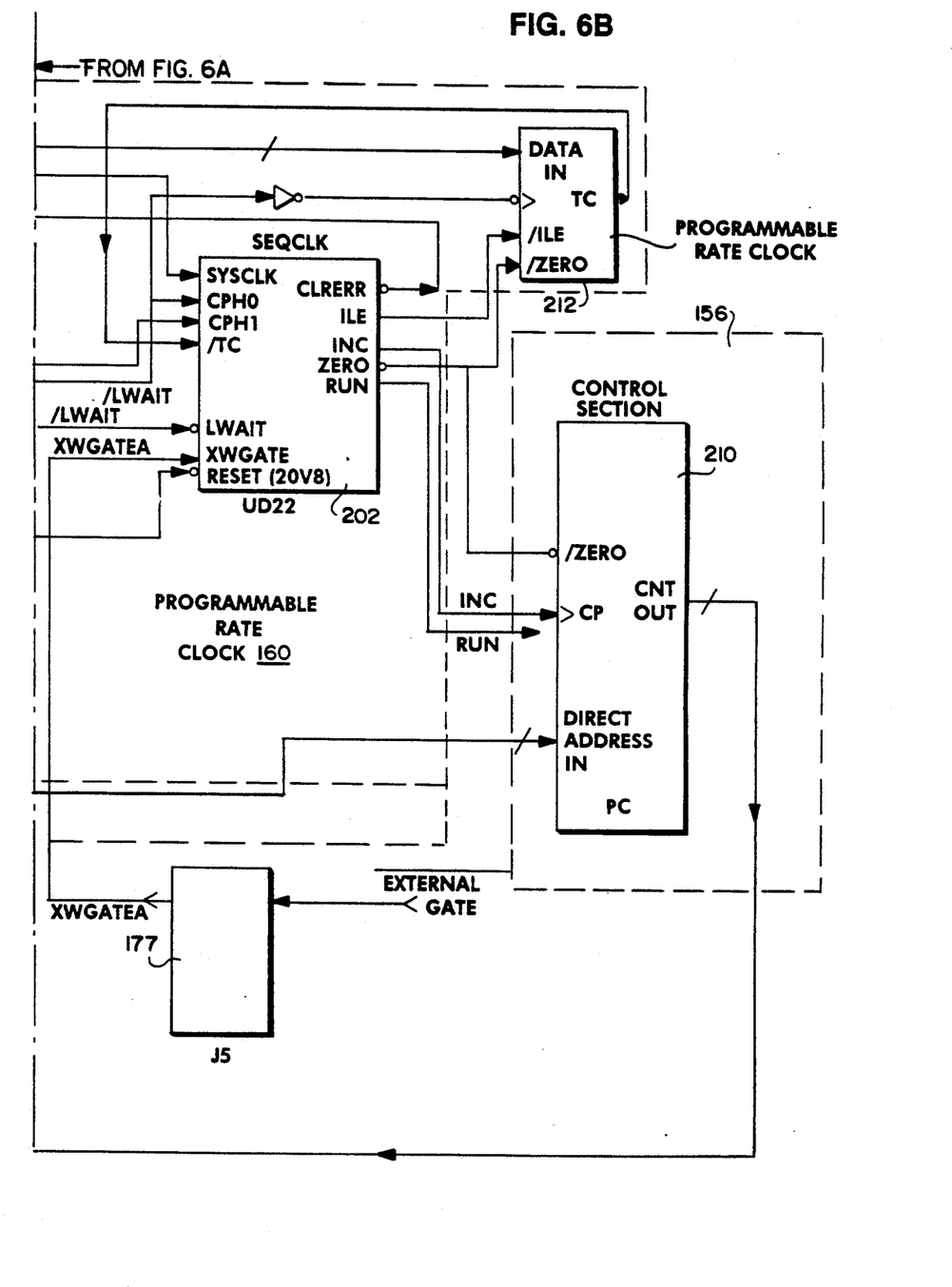

FIGS. 6A and 6B are together a detailed schematic diagram of further external gating related circuitry used in the FIG. 5 performed embodiment in accordance with the present invention. The circuitry shown in FIGS. 6A and 6B use Programmable Logic Arrays (PLAS) to implement the logic shown in FIG. 5. Referring to FIG. 6A, the WAIT bit output of WCS 150 is latched by a latch 200 and is then inverted to provide a signal /LWAIT. This /LWAIT signal is applied to the input of a PLA 202 which implements sequence clock logic (SEQCLK). PLA 202 also receives an external gating signal XWGATEA from connector 177. Clock signals CPH0 and CPH1 are applied to PLA 202 by a further CLKGEN PLA 204. PLA 204 generates a multiphase clock signal (of which CPH0 and CPH1 encode four different phases) in response to a SYSCLK signal generated by a crystal controlled clock oscillator 206. Clock oscillator 206 also applied SYSCLK directly to PLA 202.

PLA 202 generates an INC signal which it applies to the clock input of program sequence counter 210 to increment the program counter. A signal /ZERO also generated by PLA 202 is applied to a corresponding input of program sequence counter 210 to reset the program counter to zero. Program sequence counter 210 loads branch addresses from WSC 150 when a branch microinstruction is executed, and in turn sequentially addresses the locations of the WSC. A sequencer time register 212 operated in response to control signals /ILE and /ZERO produced by PLA 202 (and in response to the inverted clock /CPH0 signal) loads a clock time field contents from a microinstruction and counts down so as to time the duration of the current state. When the counter 212 has counted down, it produces a signal /TC that is also applied to PLA 202 so as to trigger generation of the control signal INC used to cause the next state transition to occur. /ZERO resets counter 212 when the program sequence counter 210 is reset by SEQCLK.

The following is a description of pertinent portions of the Boolean logic functions implemented by PLA 202:

INC=RUN & PH0 & /ZERO

OR

RUN PH0 & ENA & ((NOT TC &NOT LWAIT)
    OR (XWGATE & LWAIT))

OR

RUN & PH1 & INC where PH0 and PH1 are clock phases CPH0 and CPH1. The ENA and RUN signals are asserted when the sequencer is running (RUN and ENA are generated within PLA 202 in response to further control signals and are unasserted at times not relevant to the present discussion of external gating functionality).

The first line of the expression above allows an initial sequencer state transition at the beginning of a sequence.

The second line of the expression, causes INC to be generated if the signal RUN, the clock phase CPH0, the enable signal ENA, the LWAIT signal, and the external gating signal XWGATE signal are properly asserted. Note the term "(XWGATE & LWAIT)" which requires the external gating signal and the WAIT bit to be active simultaneously. If the WAIT bit is not asserted, then the advance to the next microinstruction occurs independently of the external gating signal XWGATE. This is a level dependent implementation, in that the continuous assertion of the external gating signal causes the Wait bit to be ignored. The other term "(NOT TC & NOT LWAIT)" allows INC to be generated when the WAIT bit is not set as soon as the sequence timer 212 times out (thus indicating the end of the current state).

The third line of the expression set forth above causes the INC signal to be held for a total of 125 nanoseconds in response to the next phase PH1 of the clock (i.e., to provide time for counter 170 to load).

The operation of the FIG. 6A, 6B circuit will now be explained. The WAIT bit field is stored in the WCS 150 and is latched into latch 200 at the beginning of a microcode instruction execution cycle. The latched WAIT bit LWAIT is sent to PLA 202. External gate signal XWGATEA is used to signal when to advance beyond the WAIT microinstruction in which the WAIT bit is turned on. The result of asserting the XWGATEA signal is to generate an INC signal which causes the sequencer to go to the next state.

Figure 7:
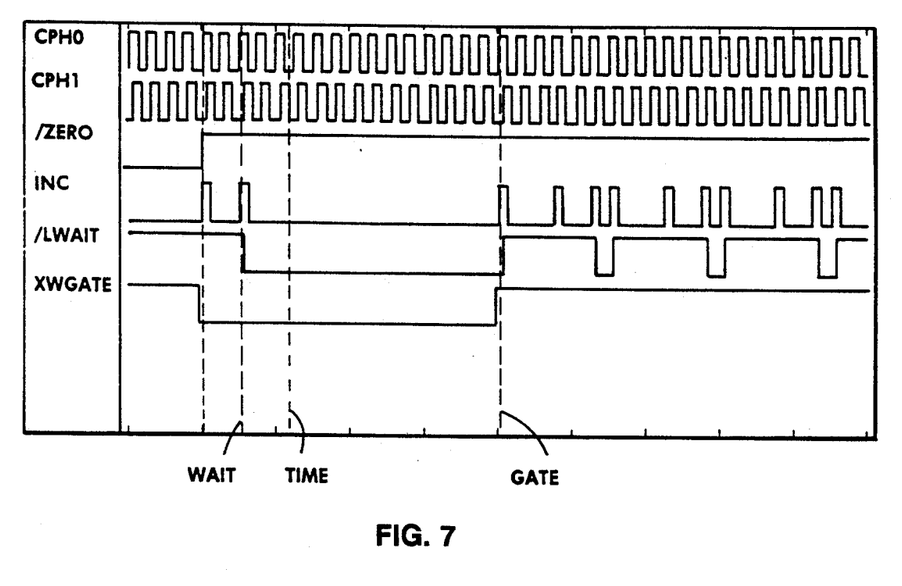
FIG. 7 is a timing diagram of exemplary signals produced by the circuitry shown in FIGS. 6A and 6B.

FIG. 7 is a timing diagram of exemplary signals produced by the circuit shown in FIGS. 6A and 6B. The signals CPH0 and CPH1 encode the four clock phases. /Zero is unasserted at logic level 1 whenever the sequencer is running. The INC signal is generated at time intervals corresponding to timing out of a sequence timer 212 that, like the programmable counter shown in FIG. 4, loads the clock time field from the microinstruction and times the duration of the current state. The variations in timing of the INC signal are dependent upon the contents of the microinstruction clock time field, but are also dependent upon external gating if the WAIT bit field is set.

The dotted line indicated at "WAIT" indicates the beginning of a state in which the WAIT bit is set (as indicated by the /LWAIT signal being asserted as active low). The dotted line indicated as "TIME" indicates an exemplary instant in time at which sequencer timer 212 times out and a state transition would thus occur if the external gating signal was unasserted (i.e., pulled up to logic level 1). However, since the /LWAIT bit is asserted as active low and the WAIT bit is also asserted, PLA does not permit the signal INC to be generated until

PH0 & XWGATE & LWAIT (i.e., the first CPH0 positive clock cycle occurring after the rising edge of the XWGATE signal). When XWGATE rises and the next phase 1 clock occurs, INC is generated (at "GATE" shown in FIG. 6) to cause the next state transition to occur.

If XWGATE were unasserted (i.e., at logic level 1), then the expression

PH0 & XWGATE & LWAIT implemented by PLA 202 would be true as soon as the following PH1 clock pulse occurs and sequencer 140 does not wait.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A microcode sequencer in a nuclear magnetic resonance imaging system, said microcode sequencer having a changeable state, said sequencer including:
    a clock generator for generating clock pulses;
    a control store for storing a sequence of instructions for execution in said nuclear magnetic resonance imaging system, said instructions including a wait instruction and other instructions; and
    control logic means, connected to an external gating input and connected to fetch said instructions stored by said control store, said control logic means for executing said instructions by performing the following functions:
    (a) fetching said wait instruction stored by said control store;
    (b) detecting a level existing on said external gating input to determine whether said external gating input is at a first level or at a second level different from said first level;
    (c) if said first level is detected, waiting in response to said fetched wait instruction until said external gating input changes levels and a generated clock pulse occurs and then changing state in response to a fetched next instruction in said sequence of instructions, and
    (d) if said second level is detected, changing state in response to said fetched next instruction when a generated clock pulse occurs without waiting for said external gating input level change.

2. A method for operating a microcode sequencer in a nuclear magnetic resonance imaging system, said microcode sequencer including a control store for storing a sequence of instructions including WAIT instructions and other instructions, a clock generator for generating clock pulses, and control logic means connected to an external gating input and connected to fetch and execute said sequence of instructions from said control store, said sequencer defining a changeable state that is determined at least in part by said sequence of instructions, said method performed by said control logic means in execution of said sequence of instructions, in response to receipt of a WAIT instructions, said method comprising the following steps:

(a) detecting, in said nuclear magnetic resonance imaging system, whether a level existing on said external gating input is at a first level or at a second level different from said first level, (b) if said first level is detected, waiting in response to said receipt of sadi WAIT instruction until said external gating input changes levels and a generated clock pulse occurs before changing sequencer state in response to a fetched next instruction in said sequence, and (c) if said second level is detected, changing said sequencer state in response to the fetched next instruction when a generated clock pulse occurs without waiting for said external gating input to change levels if said second level is detected.

3. A method of operating a microcode sequencer in a nuclear magnetic resonance imaging system, said microcode sequencer including a control store for storing instructions, a clock generator for generating clock pulses, and control logic means connected to an external gating input and connected to receive and to fetch said sequence of instructions from said control store, said sequencer having at least first and second states, said method comprising the following steps:

(a) loading into said control store a sequence of instructions for execution in said nuclear magnetic resonance imaging system, said sequence of instructions including a WAIT instruction, said sequence of instructions to be executed by said control logic means in an external gating mode or in a non-gated mode depending upon conditions existing during execution of said sequence of instructions;

(b) upon encountering said WAIT instruction, detecting a level existing on said external gating input and determining whether said external gating input is at a first level or at a second level different from said first level, said external gating mode and said non-gated mode respectively corresponding to said first and second levels, (c) if said detecting step (b) detects said first level, changing the state of said sequencer from said first state to said second state at a time conditioned on when said external gating input changes levels and a generated clock pulse occurs, and (d) if said detecting step (b) detects said second level, changing the state of said sequencer from said first state to said second state when a generated clock pulse occurs without waiting for the external gating input level change.

4. A method of operating a microcoded control sequencer controlling a nuclear magnetic resonance imaging system, said sequencer having provided thereto a microcode instruction sequence including at least one microcode instruction encoding a WAIT command, said sequencer receiving an external gating signal, said being performed during execution of said microcode instruction sequence and method comprising the following steps:

(a) generating clock pulses;

(b) determining in said nuclear magnetic resonance imaging system whether a provided microcode instruction enables said WAIT command;

(c) if said determining step determines said microcode instruction does encode said WAIT instruction, testing a level of said external gating signal;

(d) if said testing step (c) reveals said external gating signal level is at a first predetermined level, ignoring the WAIT command determined by said determining step (b) and executing a further microcode instruction; and (e) waiting until said external gating signal level changes and a generated clock pulse occurs before executing the further microcode instruction if said determining step (b) determines that said provided microcode instruction encodes said WAIT command and said testing step (c) reveals said external gating signal is at a level that is different from said first predetermined level.

5. The method as in claim 4 further including the step of repeating said steps (a) through (c) for another said sequence of microcode instructions.

6. A microcode sequencer in a nuclear magnetic resonance imaging system, said microcode sequencer including:

a control store for storing a sequence of microcode commands for execution in said nuclear magnetic resonance imaging system, said microcode commands including a WAIT command and other commands;

a clock generator for generating clock pulses; and control logic means, connected to an external gating input and connected to receive said sequence of commands from said control store, for executing said commands performing the following functions:

(a) receiving said WAIT command;

(b) detecting a level existing on said external gating input to determine whether said external gating input is at a first level or a second level different from said first level, (c) waiting, in response to receipt of said WAIT command, until said external gating input changes levels and said clock generator generates a next clock pulse before executing a next command in said sequence if said detecting step (b) detects said first level, and (d) in response to receipt of said WAIT command, executing said next command without waiting for said external gating input to change levels if said detecting step (b) detects said second level.

7. The microcode sequencer as in claim 6 wherein said control logic means includes:

a WAIT bit latch for synchronizing a WAIT bit received from said WAIT command with said next clock pulse, said WAIT bit latch generating mutually exclusive first or second output signal levels on a first output thereof responsive to the value of said WAIT bit; and an external gate latch for synchronizing said external gate input level with said next clock pulse, said external gate latch being operatively connected to said WAIT bit latch first output, said external gate latch being asynchronously held in a predetermined state in response to a first output signal outputted by said WAIT bit latch.

8. The microcode sequencer as in claim 6 wherein said control logic means includes at least one programmable logic array integrated circuit.

9. The microcode sequencer as in claim 6 further including a pipeline register operatively coupled between said control store and said control logic means for latching a fetched command.

* * * * *